United States Patent
Chan et al.

(10) Patent No.: US 10,020,328 B2
(45) Date of Patent: Jul. 10, 2018

(54) TEST ELEMENT UNIT, ARRAY SUBSTRATE, DISPLAY PANEL, DISPLAY APPARATUS, AND METHOD OF MANUFACTURING ARRAY SUBSTRATE

(71) Applicant: BOE Technology Group Co., Ltd., Beijing (CN)

(72) Inventors: Yu-Cheng Chan, Beijing (CN); Shuai Zhang, Beijing (CN); Qi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/527,792

(22) PCT Filed: Oct. 19, 2016

(86) PCT No.: PCT/CN2016/102579
§ 371 (c)(1),
(2) Date: May 18, 2017

(87) PCT Pub. No.: WO2017/067458
PCT Pub. Date: Apr. 27, 2017

(65) Prior Publication Data
US 2018/0083051 A1 Mar. 22, 2018

(30) Foreign Application Priority Data
Oct. 19, 2015 (CN) .......................... 2015 1 0679983

(51) Int. Cl.
*H01L 23/58* (2006.01)
*H01L 27/12* (2006.01)
(Continued)

(52) U.S. Cl.
CPC .......... *H01L 27/1296* (2013.01); *H01L 22/12* (2013.01); *H01L 22/34* (2013.01);
(Continued)

(58) Field of Classification Search
CPC ............. H01L 27/1222; H01L 27/1251; H01L 27/1296; H01L 27/1255; H01L 22/12;
(Continued)

(56) References Cited

U.S. PATENT DOCUMENTS 7,052,940 B2 * 5/2006 Lee ................... H01L 29/66757
257/E21.413
7,888,683 B2 2/2011 Shin et al.
(Continued)

FOREIGN PATENT DOCUMENTS

CN 101582439 11/2009
CN 101692142 4/2010
(Continued)

OTHER PUBLICATIONS

First Office Action from Chinese Patent Application No. 201510679983.0, dated Jul. 24, 2017, 17 pages.
(Continued)

*Primary Examiner* — Yosef Gebreyesus
(74) *Attorney, Agent, or Firm* — Westman, Champlin & Koehler, P.A.

(57) ABSTRACT

The present disclosure provides a test element unit, an array substrate, a display panel, a display apparatus and a corresponding manufacturing method. The test element unit includes: a plurality of layers of test patterns, each layer of test pattern including at least one test block and at least one capacitor being formed between test blocks located in different layers, and, two electrodes of each of capacitors being two test blocks located in different layers, respectively, so that it can determined whether or not corresponding components and devices formed in the display region meet requirements by detecting the test patterns formed in the test region.

20 Claims, 7 Drawing Sheets

(51) Int. Cl.
*H01L 21/66* (2006.01)
*H01L 29/786* (2006.01)

(52) U.S. Cl.
CPC ........ *H01L 27/124* (2013.01); *H01L 27/1222* (2013.01); *H01L 27/1251* (2013.01); *H01L 27/1255* (2013.01); *H01L 29/78675* (2013.01)

(58) Field of Classification Search
CPC .. H01L 22/34; H01L 27/124; H01L 29/78675
See application file for complete search history.

(56) References Cited

U.S. PATENT DOCUMENTS

| | | | |
|---|---|---|---|
| 8,883,523 B2 | 11/2014 | Guo et al. | |
| 8,884,288 B1 | 11/2014 | Li et al. | |
| 2004/0119075 A1* | 6/2004 | Murade | G02F 1/136227 257/72 |
| 2005/0060673 A1 | 3/2005 | Mahanpour | |
| 2009/0127605 A1* | 5/2009 | Shiraki | H01L 21/84 257/296 |
| 2011/0027917 A1* | 2/2011 | Shinkawata | G03F 9/7084 438/16 |
| 2014/0062520 A1* | 3/2014 | Kim | H01L 51/0031 324/762.01 |
| 2015/0311130 A1 | 10/2015 | Zhang et al. | |

FOREIGN PATENT DOCUMENTS

| | | |
|---|---|---|
| CN | 102243443 | 11/2011 |
| CN | 102375252 A | 3/2012 |
| CN | 103246092 | 8/2013 |
| CN | 103367329 A | 10/2013 |
| CN | 104345484 | 2/2015 |
| CN | 104576615 | 4/2015 |
| CN | 105206601 | 12/2015 |
| CN | 205092238 | 3/2016 |
| KR | 10-2008-0037343 | 4/2008 |

OTHER PUBLICATIONS

International Search Report and Written Opinion for International Application No. PCT/CN2016/102579, dated Jan. 24, 2017 including the English Translation.

* cited by examiner

TEST ELEMENT UNIT, ARRAY SUBSTRATE, DISPLAY PANEL, DISPLAY APPARATUS, AND METHOD OF MANUFACTURING ARRAY SUBSTRATE

CROSS-REFERENCE TO RELATED APPLICATION

This application is a national phase application from PCT/CN2016/102579 filed on Oct. 19, 2016 and claims the benefit of Chinese Patent Application No. 201510679983.0 filed on Oct. 19, 2015 in the State Intellectual Property Office of China, the whole disclosure of which is incorporated herein by reference.

BACKGROUND

Technical Field

Embodiments of the present disclosure generally relate to the field of display technology, and particularly to a test element unit, an array substrate, a display panel, a display apparatus and a method of manufacturing an array substrate.

Description of the Related Art

Nowadays, people have much higher demands on high resolution display. Higher resolution of a display means that the number of pixels in a display panel of the display is greater, and the greater number of pixels has more demands on process capability of manufacturing the display panel; as a result, requirements on timeliness of detection to the process capability also need to be improved.

Existing detection technology generally requires a number of test element units to be designed in different layers, and then performs a test of a single function in single layer. Accordingly, when a process of manufacturing a subsequent layer is performed, the existing detection technology cannot implement a real-time detection if it is found that the process is abnormal.

Especially, a number of photo masks and complicated processes are required for a device with a top gate structure using low-temperature polysilicon technology (LTPS) and the like, which will cause a great waste of production cost and time on products if any defect occurred in production process is not reflected immediately.

SUMMARY

In view of the above, an object of the present disclosure is to provide a real-time test element unit or test element group (TEG), by which process parameters of existing equipment and process in a multi-layer process can be real-time monitored and determined, and the process parameters can be adjusted promptly based on a result of the detection, thereby enhancing process stability, improving process performance and reducing the risk of poor process and the waste caused by the poor process.

Another object of the present disclosure is to provide a real-time test element unit, by which different inter-layered capacitors can be real-time monitored.

Yet another object of the present disclosure is to provide a real-time test element unit, which can perform at least one of the tests on overlapping characteristic, process capability, capacitances, and lengths of different channels of thin film transistor devices, or can combine at least two of the tests together and complete the above tests using a same one real-time test element unit, so as to reduce cost of the tests.

A further object of the present disclosure is to provide an array substrate having such test element unit and a method of manufacturing the array substrate, which reduces production cost.

In accordance with one aspect of the present disclosure, there is provided a test element unit, comprising: a plurality of layers of test patterns, each layer of test patterns comprising at least one test block, at least one capacitor being formed between test blocks located in different layers, two electrodes of each capacitor being two test blocks located in different layers, respectively.

In one embodiment, each layer of test patterns further comprises a plurality of test lines, and, at least one of the two test blocks forming the capacitor is electrically connected to at least one of the test lines located in the same layer therewith.

In one embodiment, the at least one of the test lines electrically connected to the at least one of the two test blocks forming the capacitor is further electrically connected to at least one test block which does not form the capacitor.

In one embodiment, the plurality of test blocks comprise a gate metal test block formed of a metal layer used for formation of a gate, a source-drain metal test block formed of a metal layer used for formation of a source electrode and a drain electrode, and a pixel electrode metal test block formed of a pixel electrode layer used for formation of a pixel electrode, and the gate metal test block, the source-drain metal test block and the pixel electrode metal test block are located in different layers.

In one embodiment, the plurality of test lines comprises a polysilicon test line, a gate metal test line formed of a metal layer used for formation of a gate, a source-drain metal test line formed of a metal layer used for formation of a source electrode and a drain electrode, and a pixel electrode test line formed of a pixel electrode layer used for formation of a pixel electrode.

In one embodiment, spacer layers are provided between different layers of test patterns, and the spacer layers comprise at least one of a gate insulation layer and an interlayer insulation layer.

In one embodiment, two groups of test lines consisted of the polysilicon test line, the gate metal test line and the source-drain metal test line form a thin-film transistor having a first channel and a thin-film transistor having a second channel, and sizes of portions, which are configured for formation of the thin-film transistor, of the polysilicon test line, the gate metal test line and the source-drain metal test line in one of the two groups of test lines are different from sizes of corresponding portions, which are configured for formation of the thin-film transistor, of the polysilicon test line, the gate metal test line and the source-drain metal test line in the other of the two groups of test lines, so that a size of the first channel is different from a size of the second channel.

In one embodiment, the thin-film transistor having the first channel and the thin-film transistor having the second channel are configured such that, a drain electrode of the thin-film transistor having the first channel and a drain electrode of the thin-film transistor having the second channel share one test block serving as a contact electrode, and a source electrode of the thin-film transistor having the first channel and a source electrode of the thin-film transistor having the second channel share one test block serving as a contact electrode.

In one embodiment, the electrodes of the capacitor comprise any two of the gate metal test block, the source-drain metal test block and the pixel electrode metal test block located in different layers, and the capacitor comprises a dielectric layer which is one of the gate insulation layer and the interlayer insulation layer.

In one embodiment, the each layer of test patterns further comprises a test frame, wherein a projection of a test frame in an upper layer onto a lower layer is located outside a test block in the lower layer, and, an edge of the projection of the test frame in the upper layer onto the lower layer is separated from an edge of the test block in the lower layer.

In accordance with one aspect of the present disclosure, there is provided an array substrate having a display region and a non-display region and comprising: at least one said test element unit described in the present disclosure and disposed within the non-display region, and a plurality of data lines, a plurality of gate lines, a plurality of thin film transistors, a plurality of pixel electrodes disposed within the display region.

In one embodiment, the thin-film transistor comprises a top gate type thin-film transistor.

In some embodiments, at least one test element unit comprises two layers of test patterns, which include a lower layer of test patterns made of a semiconductor material and provided in the same layer as an active layer of the array substrate, and an upper layer of test patterns made of a metal material and provided in the same layer as the data lines of the array substrate; and/or at least one test element unit comprises two layers of test patterns, which include a lower layer of test patterns made of a metal material and provided in the same layer as the data lines of the array substrate, and an upper layer of test patterns made of a metal material and provided in the same layer as the gate lines of the array substrate; and/or at least one test element unit comprises two layers of test patterns, which include a lower layer of test patterns made of a metal material and provided in the same layer as the data lines of the array substrate, and an upper layer of test patterns made of a transparent electrode material and provided in the same layer as the pixel electrodes of the array substrate.

In one embodiment, at least one test element unit comprises a plurality of layers of test patterns comprising: a lower layer of test patterns made of a semiconductor material and provided in the same layer as an active layer of the array substrate, an intermediate layer of test patterns made of a metal material and provided in the same layer as the data lines of the array substrate, and an upper layer of test patterns made of a transparent electrode material and provided in the same layer as the pixel electrodes of the array substrate.

In accordance with one aspect of the present disclosure, there is provided a method of manufacturing the array substrate having a display region and a non-display region, the method comprising:

forming a plurality of layers of display patterns within the display region, while forming the test element unit described in the present disclosure within the non-display region; and, measuring at least one of a size of the test pattern and a spacing between the test patterns, a capacitance of the capacitor, and a length of a channel of a transistor formed of a test line formed of a metal layer and a spacer layer of the test patterns.

In one embodiment, the method further comprises:

determining whether or not parameters of a display pattern within the display region meet requirements, based on a result of measurement of the test patterns; and, continuing to implement a subsequent process of manufacturing the array substrate when the parameters meet the requirements.

In one embodiment, different layers of display patterns within the display region are connected with one another through via-holes passing through a spacer layer between two layers of display patterns, and the method comprises:

forming a lower layer of display patterns within the display region, while forming a lower layer of test patterns within the non-display region;

measuring parameters of the test patterns and determining whether or not the parameters meet requirements;

if the parameters meet requirements, forming a spacer layer including a gate insulation layer or an interlayer insulation layer, on the lower layer;

forming via-holes, which pass through the spacer layer, within both the display region and the non-display region, the via-holes within the non-display region being located above the test lines; and determining whether or not positions of the via-holes meet requirements.

In one embodiment, each layer of test patterns comprises at least one test block, and a capacitor is formed between a test block in a lower layer and a test block in an upper layer, and the method comprises: measuring a capacitance of the capacitor so as to determine whether or not the capacitance meet a desired requirement.

In one embodiment, each layer of test patterns comprises a plurality of test lines, and the test lines located in different layers form thin-film transistors having channels with different lengths, and the method comprises: measuring parameters of the different thin-film transistors.

In accordance with one aspect of the present disclosure, there is provided a display panel comprising the array substrate described according to the present disclosure.

In accordance with one aspect of the present disclosure, there is provided a display apparatus comprising the display panel described according to the present disclosure.

DETAILED DESCRIPTION OF THE EMBODIMENTS

Figure 1:
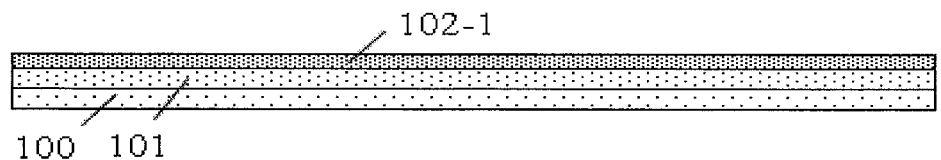
FIG. 1 is a structural schematic view in which depositions of a buffer layer and an active layer have been completed, according to an embodiment of the present disclosure.

In order to provide a more clear understanding of objects, technique solutions and advantages of the present disclosure, the present disclosure will be further described in detail hereinafter in conjunction with specific embodiments and with reference to the attached drawings.

Further, in the following detailed description, for purposes of explanation, numerous specific details are set forth in order to provide a thorough understanding of the embodiments of the present disclosure. It will be apparent, however, that one or more embodiments may be practiced without these specific details. In other instances, well-known structures and devices are schematically shown in order to simplify the drawing.

According to one embodiment of the present disclosure, there is provided a real-time test element unit or test element group (TEG), comprising: a plurality of layers of test patterns, each layer of test patterns comprising at least one test block, at least one capacitor being formed between test blocks located in different layers. The test element unit may be formed within a test region or a non-display region of display device, and may be manufactured under the same process conditions as those for components within the display region of the display device.

In one embodiment of the present disclosure, the each layer of test pattern may further comprise a plurality of test lines, and, widths of the plurality of test lines are different from one another and the plurality of test lines are separated from one another. Some of the test blocks are connected to one or more corresponding test lines.

Figure 19:
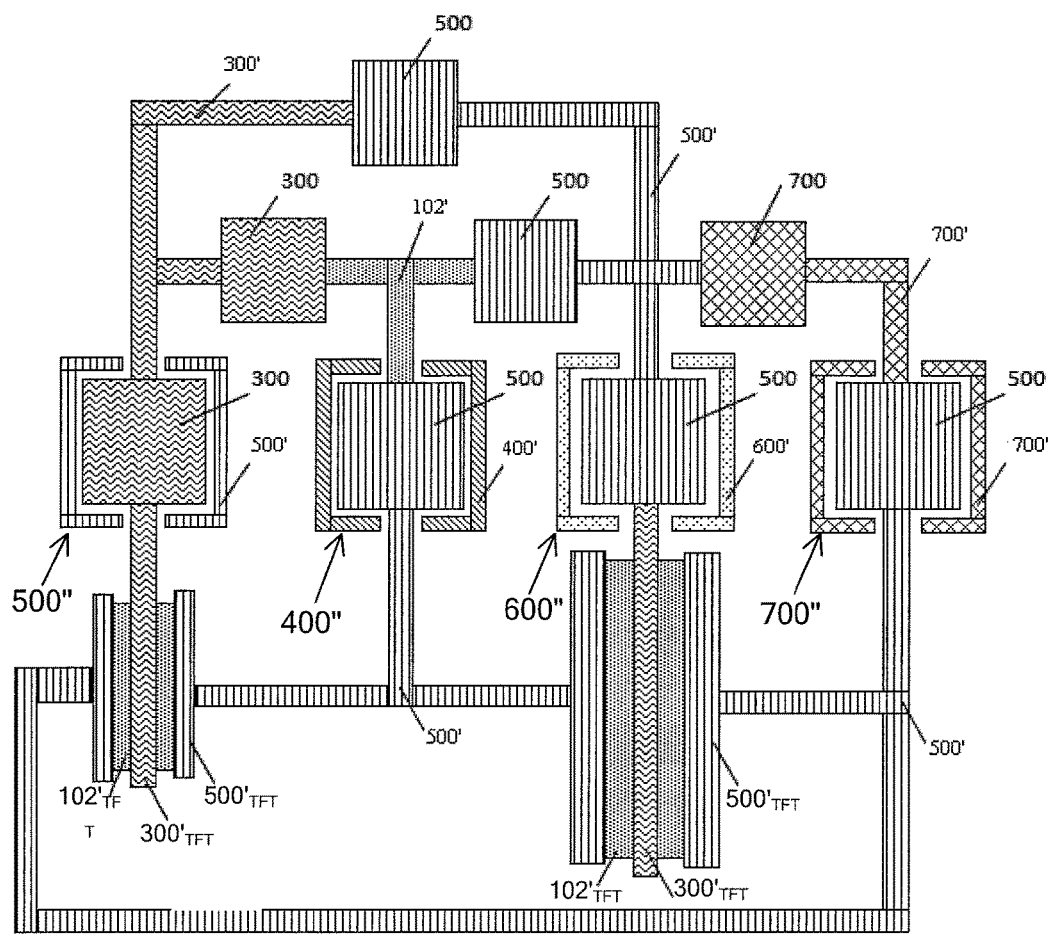
FIG. 19 is a top view showing patterns of a test element unit according to an embodiment of the present disclosure, when all the processes have been completed.

FIG. 19 is a top view showing a test element unit according to an embodiment of the present disclosure. A test pattern in a lower layer may be made of a metal material or polysilicon, and a test pattern in an upper layer may also be made of a metal material. "Upper layer" and "lower layer" mentioned herein do not indicate any specific layers, but are used to distinguish two different layers, and, the upper layer is located above the lower layer in terms of space orientation. For example, test blocks 500 and 700 are located in an upper layer above the test block 300, while test block 500 is located in an upper layer above the test block 500. In addition, FIG. 19 is also a schematic view schematically showing relative positional relationship among components in these layers of the test element unit which will be described herein, and other layers or elements not shown in Figure are omitted.

As shown in the Figure, on a semiconductor substrate 100, the test element unit comprises a plurality of test blocks 300, 500, 700 located in different layers, and a plurality of test line 102', 300', 400', 500', 600', 700' located in different layers. It should be understood that, for those skilled in the art, blocks and lines described herein may be in common shapes, for example, they may be in a quadrangular shape or also may be in a square shape, or else may be in other polygonal shape. The blocks described in these embodiments of the present disclosure are in a square shape, which mainly facilitates to calculate resistance performances of materials or devices. The lines described in these embodiments of the present disclosure are in a strip shape. Shapes of the test lines and the test blocks may preferably be the same as or similar to those of corresponding elements within the non-display region of the substrate.

In can be seen that, the test blocks located in a same layer may include a plurality of test blocks with different sizes, and the test lines located in a same layer may include a plurality of test lines with different sizes. For example, as shown in FIG. 19, a metal layer for formations of a source electrode and a drain electrode is provided with a plurality of test blocks with two different sizes (for example, test block 500), meanwhile, it may also be provided with a plurality of test lines with different sizes (for example, test line 500'). It should be understood that, a greater number of test blocks with different sizes or test lines with different sizes may be provided in accordance with specific requirement, for example, there may be a plurality of test blocks or test lines, with three, four, five or more different sizes, and, this is decided in accordance with sizes of elements in the display region. Provisions of test blocks with different sizes and test lines with different sizes can determine process conditions of all the blocks and lines with different parameters located in a same layer of the substrate. For example, by judging whether or not there is (are) notch(es) in the test blocks and the test lines, it can be determined that whether or not there is (are) notch(es) in devices located in other positions of the same layer, for example, whether or not there is(are) notch(es) in devices located within the display region of a semiconductor substrate. By comparing sizes of the test blocks and sizes of the test lines with predefined sizes, it can be determined that whether or not sizes of the devices formed within the display region and located in the same layer as the test blocks and the test lines reach predefined sizes. By judging electrical connections between the test blocks and the test lines, it can be determined that whether or not connections between similar devices within the display region meet requirements. By judging a spacing between the test blocks or a spacing between the test lines, it can be determined that whether or not a spacing between devices formed within the display region and located in the same layer as the test blocks and the test lines meet requirements. Thus it can be seen, with the test element unit according to embodiments of the present disclosure, defective process positions can be determined, so that targeted adjustments to process conditions, including widths of the devices themselves, widths of the lines, spacing between the devices, and integrality of margins of the device, can be made, thereby it can be determined whether or not these process conditions of the processes such as etchings are suitably adopted.

The test element unit may further comprise a non-closed test frame consisted of the test lines (around the test blocks). For example, as shown in FIG. 19, test lines 400', 500', 600', 700' form test frames 400", 500", 600", 700", respectively. The test frame may be provided such that a projection of the test frame onto another layer surrounds a test block in the another layer; in this way, by judging a spacing between the projection of the test frame and the corresponding test block in the another layer, overlapping relationship or spacing between devices located in different layers within the display region can be determined. For example, a spacing between a projection of the test frame onto another layer (for example, a lower layer) and margins of the corresponding test block in the another layer (for example, the lower layer) along a direction in which the layer extends (namely, along a plane where this Figure is in) can be used to determine an overlapping relationship between a device in a layer where the test frame is and a device in the layer where the test block is, thereby overlapping relationships between the corresponding elements located in different layers within the display region can be determined. Thus it can be seen that, the test element unit according to embodiments of the present disclosure can be used to determine an overlapping relationship between devices located in different layers.

In an embodiment of the present disclosure, test patterns in different layers are arranged so that overlapping between test blocks located in different layers can be measured by measuring a spacing between test blocks located in different layers along a direction in which the layers are extended (namely, along a plane where this Figure is). For example, by measuring spacing between projections of the test blocks of different layers in a same plane, overlapping between the test blocks of different layers can be measured, so that overlapping relationships between the corresponding elements located in different layers within the display region can be determined. In an embodiment of the present disclosure, as shown in FIG. 19, a source-drain metal test block 500 is located in a lower layer and a pixel electrode metal test block 700 is located in an upper layer. By measuring a spacing between the source-drain metal test block 500 and the pixel electrode metal test block 700 along a direction in which the layers are extended, overlapping between the source-drain metal test block 500 and the pixel electrode metal test block 700 located in different layers can be measured, so that overlapping between the corresponding source and drain electrode metal elements and the pixel electrode metal elements located in different layers within the display region can be determined. Moreover, for example, by measuring a spacing between projection of the pixel electrode metal test block 700 in the upper layer onto the lower layer where the source-drain metal test block 500 is formed and the source-drain metal test block 500 along the direction in which layers are extended, and then by comparing the measured spacing with a predefined spacing, it can be determined whether or not the process meets requirements, and thereby, process parameters can be adjusted promptly.

In an embodiment of the present disclosure, the plurality of test blocks comprise a gate metal test block 300 formed of a metal layer for formation of a gate, a spacer layer (dielectric layer) test block 400 formed of a spacer layer, a source-drain metal test block 500 formed of a metal layer for formation of a source electrode and a drain electrode, and a pixel electrode metal test block 700 formed of a pixel electrode layer for formation of a pixel electrode, as shown in FIG. 19. The gate metal test block can be formed while forming the metal layer for formation of the gate, the source-drain metal test block can be formed while forming the metal layer for formation of the source and the drain, and the pixel electrode test block can be formed while forming the pixel electrode layer for formation of the pixel electrode. Similarly, the polysilicon test line of the test patterns can be formed while forming the polysilicon layer, the gate metal test line of the test patterns can be formed while forming the metal layer for formation of the gate, the source-drain metal test line can be formed while forming the metal layer for formation of the source electrode and the drain electrode, and the pixel electrode test line can be formed while forming the pixel electrode layer for formation of the pixel electrode.

In an embodiment of the present disclosure, spacer layers 400 are provided between different layers of test patterns. For example, the spacer layer may be a gate insulation layer or an interlayer insulation layer. The test lines located in different layers may be connected with one another through via-holes and/or other structures (not shown in Figure), the via-holes passing through the spacer layers to connect the test lines in different layers. By measuring the test lines in the same layer, it can be determined whether or not the test lines are in short circuit. By measuring the test lines in different layers, it can be determined whether or not the test lines are in short circuit, or it can be determined whether or not the connections between the test lines and the via-holes meet predefined requirements.

In an embodiment of the present disclosure, portions of the test lines located in the different layers, for example, the polysilicon test line, the gate metal test line and the source-drain metal test line having different sizes, form a thin-film transistor having a longer channel and a thin-film transistor having a shorter channel (two sizes are shown in FIG. 19, for example, see the two thin-film transistors shown in a lower part of FIG. 19). For example, as shown in FIG. 19, two source-drain metal test lines $500'_{TFT}$ are respectively located on either side of the polysilicon test line $102'_{TFT}$, and the gate test line $300'_{TFT}$ is located at a middle position; a spacer layer 200 is provided between the gate test line $300'_{TFT}$ and the polysilicon test line $102'_{TFT}$, and a spacer layer, for example a gate insulation layer, is provided between the gate test line $300'_{TFT}$ and the source-drain metal test lines $500'_{TFT}$. In this way, as shown in the lower part of FIG. 19, two thin-film transistors having channels of different sizes are formed. It should be noted that, the test line $102'_{TFT}$, the gate test line $300'_{TFT}$ and the test lines $500'_{TFT}$ mentioned herein are actually the same as those in other layers, and different reference numerals are used for merely distinguish the test lines located at different positions of the same layer. In an embodiment of the present disclosure, for example, the test line $102'_{TFT}$, the gate test line $300'_{TFT}$ and the test lines $500'_{TFT}$ have different widths so as to form at least two or more thin-film transistors having channels of different sizes. In other embodiments of the present disclosure, a plurality of thin-film transistors may be formed, and channels of these thin-film transistors are different in size from one another, which may be set by those skilled in the art under the teachings from embodiments of the present disclosure. By measuring the thin-film transistors of different sizes, characteristics of the transistor devices within the display region, for example, related parameters of the thin-film transistors, including length of channel, response speed of carriers, threshold characteristic, carrier mobility ratio and the like, can be determined. Also, thickness, insulation performance and the like of the spacer layer can be determined using characteristics of the transistor.

In an embodiment of the present disclosure, the test lines and the test blocks located in different layers can be connected through via-holes (not shown), and, the test lines and the test blocks in the same layer can be connected directly. In another embodiment of the present disclosure, at least one of the two test blocks forming the capacitor is electrically connected to at least one of the test lines being in the same layer therewith, and the at least one of the test lines electrically connected to the at least one of the two test blocks forming the capacitor can be further electrically connected to at least one test blocks not forming the capacitor. Diameters of the plurality of via-holes can be different from one another, so as to fit widths of the test lines having different sizes, meanwhile, to determine whether or not the process of forming via-holes having different sizes reach predefined parameters.

In an embodiment of the present disclosure, electrodes of the capacitor comprise any two of the gate metal test block 300, the source-drain metal test block 500 and the pixel electrode metal test block 700 located in different layers, and a dielectric layer of the capacitor comprises one of the gate insulation layer and the interlayer insulation layer. Parameter measurement to the capacitor may further provide dielectric performance information of the spacer layer.

In another embodiment of the present disclosure, there is provided an array substrate comprising the test element unit. The array substrate has a display region and a non-display region, at least one test element unit is disposed within the non-display region, and a plurality of data lines, a plurality of gate lines, a plurality of thin film transistors, a plurality of pixel electrodes are disposed within the display region. The test element unit is one according to embodiments of the present disclosure as described herein.

In an embodiment of the present disclosure, the thin-film transistor may be a top gate type thin-film transistor.

In an embodiment of the present disclosure, the test element unit may comprise a plurality of layers of test patterns, for example, two layers of test patterns, including a lower layer of test patterns made of a semiconductor material and provided in the same layer as an active layer of the array substrate, and an upper layer of test patterns made of a metal material and provided in the same layer as the data lines of the array substrate. In another embodiment, the test element unit comprises two layers of test patterns, including a lower layer of test patterns is made of a metal material and provided in the same layer as the data lines of the array substrate, and an upper layer of test patterns made of a metal material and provided in the same layer as the gate lines of the array substrate. In yet another embodiment, the test element unit comprises two layers of test patterns, including a lower layer of test patterns made of a metal material and provided in the same layer as the data lines of the array substrate, and an upper layer of test patterns made of a transparent electrode material and provided in the same layer as the pixel electrodes of the array substrate. In an embodiment, the test element unit comprises three layers of test patterns, including a lower layer of test patterns made of a semiconductor material, for example a polysilicon material, and provided in the same layer as an active layer of the array substrate, an intermediate layer of test patterns made of a metal material and provided in the same layer as the data lines of the array substrate, and an upper layer of test patterns made of a transparent electrode material and provided in the same layer as the pixel electrodes of the array substrate. In an embodiment of the present disclosure, the test element unit comprises a plurality of layers of test patterns comprising: a lower first layer of test patterns made of a semiconductor material, for example a polysilicon material, and provided in the same layer as an active layer of the array substrate, an intermediate second layer of test patterns made of a metal material and provided in the same layer as the data lines of the array substrate, and an upper third layer of test patterns made of a transparent electrode material and provided in the same layer as the pixel electrodes of the array substrate; further, a spacer layer, for example an interlayer insulation layer, a gate insulation layer and the like, provided between the layers of test patterns.

In an embodiment of the present disclosure, different layers of test patterns are connected through via-holes.

In an embodiment of the present disclosure, there is provided a display panel comprising the abovementioned array substrate.

In an embodiment of the present disclosure, there is provided a display apparatus comprising the abovementioned display panel.

In an embodiment of the present disclosure, there is provided a method of manufacturing an array substrate comprising a display region and a non-display region, and the method comprises: forming a plurality of layers of display patterns within the display region, while forming at least two abovementioned layers of test patterns within the non-display region; and, measuring at least one of a size of the test pattern and a spacing between the test patterns, a capacitance of the capacitor, and a length of a channel of a transistor formed of a test line formed of a metal layer and a spacer layer of the test patterns. In an embodiment, the method may further comprise: determining whether or not parameters within the display region meet requirements, by referring to a result of measurement of the test patterns; and, continuing to implement a subsequent process of manufacturing the array substrate, for example, a subsequent film manufacturing process, when the parameters meet the requirements; or, entering a next stage, for example, an assembling process and the like, when all the results of measurement meet requirements. In addition, parameters which do not meet the requirements can be adjusted, so as to achieve parameters which meet the requirements after adjustment. In this way, in a reproduce process, or in a subsequent process of manufacturing the array substrate, the adjusted parameters may be used to form the display patterns within the display region.

In an embodiment of the present disclosure, different layers of display patterns within the display region are connected with one another through via-holes passing through a spacer layer between two layers of display patterns, and the method comprises: forming a lower layer of display patterns within the display region, while forming a lower layer of test patterns within the non-display region; measuring parameters, including size and spacing, of the test patterns and determining whether or not the parameters meet requirements; if not, adjusting the parameters; if yes, forming a spacer layer including a gate insulation layer or an interlayer insulation layer, on the lower layer; forming via-holes, which pass through the spacer layer, within both the display region and the non-display region, the via-holes within the non-display region being located above the test lines; and, determining whether or not positions of the via-holes meet requirements; adjusting positions of the via-holes if the positions of the via-holes are located away from desired positions; and, repeating the above steps, for forming subsequent layers.

Each layer of test pattern may comprise at least one test block, and a capacitor is formed between a test block in a lower layer and a test block in an upper layer. For example, referring to FIG. 18, a capacitor is formed at an overlapping portion between an active layer 102 and a source-drain metal test block 500 in an upper layer. The method according to embodiment of the present disclosure may further comprise: measuring a capacitance of the capacitor, and determining whether or not the capacitance meet a desired requirement. With the method according to embodiments of the present disclosure, each layer of test pattern comprises a plurality of test lines, and the test lines may have different widths and are separated from one another, and the test lines located in different layers may be made of different materials. The method according to embodiments of the present disclosure may further comprise measuring parameters of the thin-film transistors having channels of different lengths, formed of the test lines located in different layers.

In the method according to embodiment of the present disclosure, the lower layer of display patterns comprises an active layer while the upper layer of display patterns comprises a data line, a source electrode and a drain electrode; and/or, the lower layer of display patterns comprises a data line, a source electrode and a drain electrode while the upper layer of display patterns comprises a gate line; and/or the lower layer of display patterns comprises a data line, a source electrode and a drain electrode while the upper layer of display patterns comprises a pixel electrode.

In the embodiments of the present disclosure, size of the test line itself can be used to determine whether or not related process of a line component meet predefined requirements. Meanwhile, metal test lines of the test lines can be used to connect test blocks in different layers, so as to determine whether or not electrical connections between different layers, and the capacitors and the thin-film transistor formed by test blocks located in different layers meet predefined requirements. As a result, according to the embodiments of the present disclosure, no test line dedicated to determine width of the line and the like is required, and, the test lines for formation of capacitor can be used to determine whether or not the test lines are integral, whether or not sizes of the test lines meet predefined requirement, thereby reducing quantity of the test lines. According to the embodiments of the present disclosure, a test element unit used for monitoring can be respectively provided in an active layer, a gate layer, a space layer, a source-drain metal layer and a pixel electrode layer, so as to real-time monitor sizes of respective layers of test lines, capacitances, and characteristics of the thin-film transistors having longer and shorter channels. According to the embodiments of the present disclosure, monitoring operations on overlapping of different layers, parameters of various different processes including patterning process, photolithography alignment process and the like, capacitances, the thin-film transistors having longer and shorter channels, can be combined together, which reduces complexity and thus saves costs.

According to an embodiment of the present disclosure, a method of forming a test element unit may specifically include the followings.

1) a substrate 100, which is made of transparent material such as glass is provided, and a cleaning process is implemented on the substrate 100. A buffer layer 101 and an amorphous silicon thin film 102-1 are sequentially formed on the substrate by using a plasma enhanced chemical vapor phase epitaxial method. The buffer layer 101 may be a single layer or a composite layer formed of silicon oxide or silicon nitride, preferably, the silicon oxide has a thickness of 50~100 nm, the silicon nitride has a thickness of 100~300 nm and the amorphous silicon thin film has a thickness of 40~50 nm, as shown in FIG. 1. Then, the substrate is transported to a high temperature furnace for processing, in order to achieve dehydrogenation (namely, to reduce the content of hydrogen in the amorphous silicon thin film), so as to control the content of hydrogen to be equal to or less than 2%.

Figure 2:
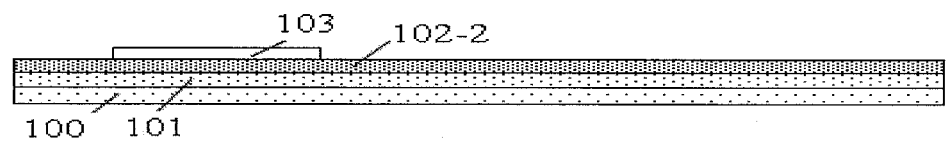
FIG. 2 is a schematic view in which exposures and developments of the buffer layer and the active layer have been completed, according to an embodiment of the present disclosure.

2) Then, the substrate is annealed, for example, using excimer laser annealing, to convert the amorphous silicon thin film into a polysilicon active layer 102-2, and then a photoresist layer is formed on the active layer 102-2, and, the photoresist layer is processed by processes including lithography, exposure, development and the like, to form a photoresist pattern 103 corresponding to an pattern of active layer, as shown in FIG. 2.

Figure 3:
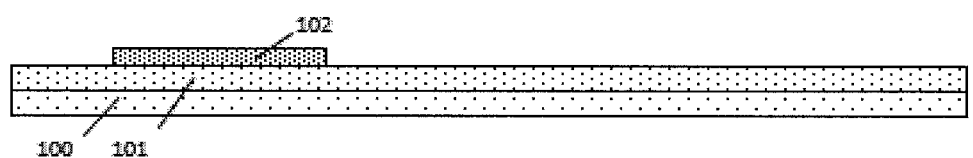
FIG. 3 is a cross-sectional view in which etching and stripping of the active layer have been completed, according to an embodiment of the present disclosure.

3) The active layer is etched to remove a portion of the active layer not being covered with the pattern 103, and then the photoresist is stripped, using a stripping apparatus, to form a pattern of the active layer 102, as shown in FIG. 3. The pattern of the active layer 102 may comprise a plurality of polysilicon test lines which have different predefined widths and are separated from one another.

Figure 4:
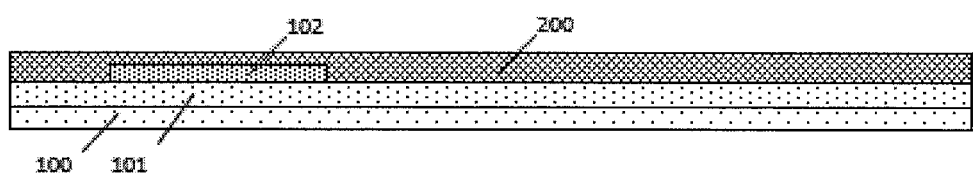
FIG. 4 is a structural schematic view in which deposition of a gate insulation layer has been completed, according to an embodiment of the present disclosure.

4) A gate insulation layer 200 is deposited using, again, a plasma enhanced chemical vapor phase epitaxial method, as shown in FIG. 4.

Figure 5:
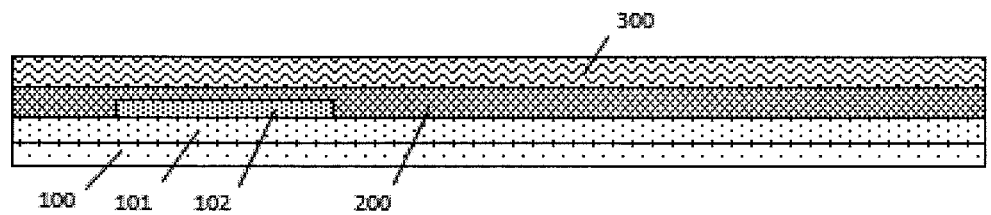
FIG. 5 is a cross-sectional view in which deposition of a gate metal layer has been completed, according to an embodiment of the present disclosure.
Figure 6:
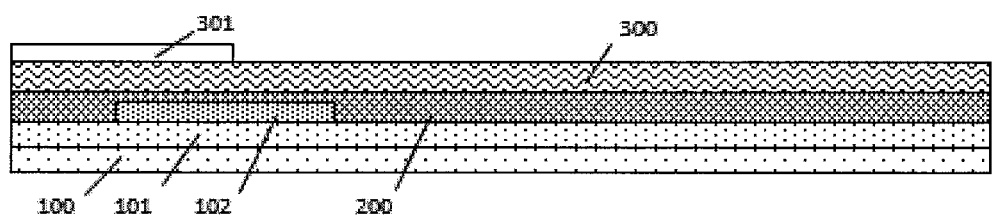
FIG. 6 is a schematic view in which exposure and development of the gate metal layer have been completed, according to an embodiment of the present disclosure.
Figure 7:
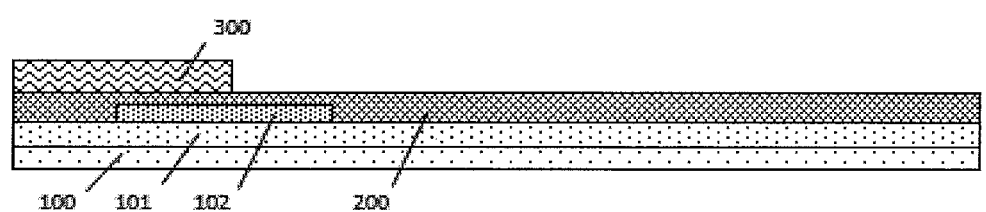
FIG. 7 is a cross-sectional view in which etching and stripping of the gate metal layer have been completed, according to an embodiment of the present disclosure.

5) Then, a gate metal layer 300 is deposited using for example a sputtering process, as shown in FIG. 5. After that, a photoresist layer is formed on the gate metal layer 300, and a gate photoresist pattern 301 is formed by performing lithography processes including exposure and development on the photoresist layer, then the gate metal layer is etched, and finally, the photoresist is stripped, using a stripping apparatus, to form a pattern of the gate, as shown in FIG. 6 and FIG. 7. The pattern formed of the gate metal layer 300 may comprise a plurality of gate metal test lines and a plurality of gate metal test blocks. In an example, the gate metal test lines may have different predefined widths and are separated from one another, and, the gate metal test blocks are different in sizes and are separated from one another.

Figure 8:
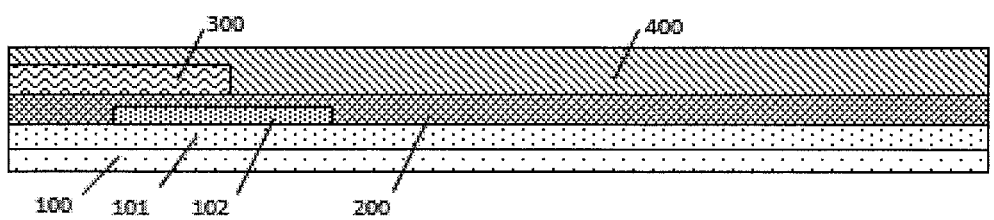
FIG. 8 is a cross-sectional view in which deposition of an internal dielectric layer has been completed, according to an embodiment of the present disclosure.
Figure 9:
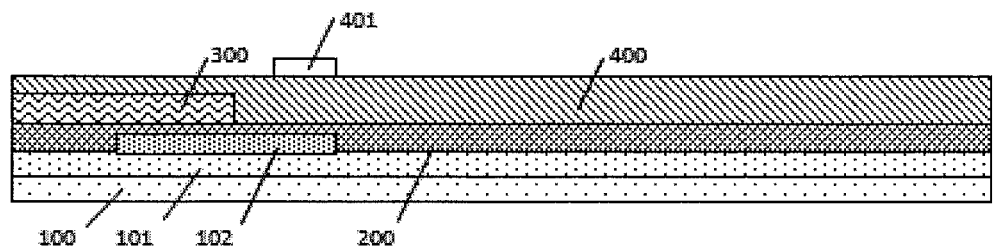
FIG. 9 is a schematic view in which exposure and development of the internal dielectric layer have been completed, according to an embodiment of the present disclosure.
Figure 10:
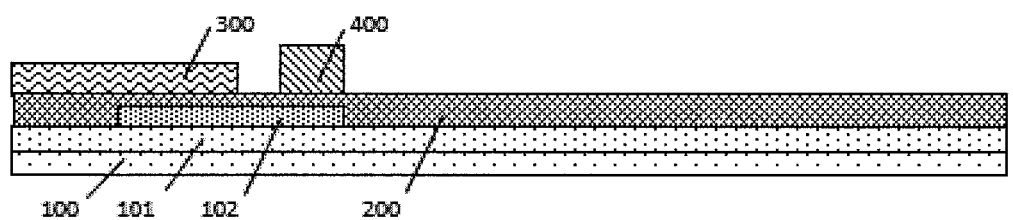
FIG. 10 is a schematic view in which etching and stripping of the internal dielectric layer have been completed, according to an embodiment of the present disclosure.

6) Then, a dielectric layer, for example, an interlayer dielectric layer 400, is deposited using, again, a plasma enhanced chemical vapor phase epitaxial method. After deposition of the interlayer dielectric layer, a photoresist layer is formed on the dielectric layer 400, and a dielectric layer photoresist pattern 401 is formed by performing lithography processes including exposure and development on the photoresist layer, and the dielectric layer is etched so that a portion of the dielectric layer not being covered with the pattern 401 is removed, and finally, the photoresist is stripped, using a stripping apparatus, to form a resultant pattern of the dielectric layer, as shown in FIGS. 8-10.

Figure 11:
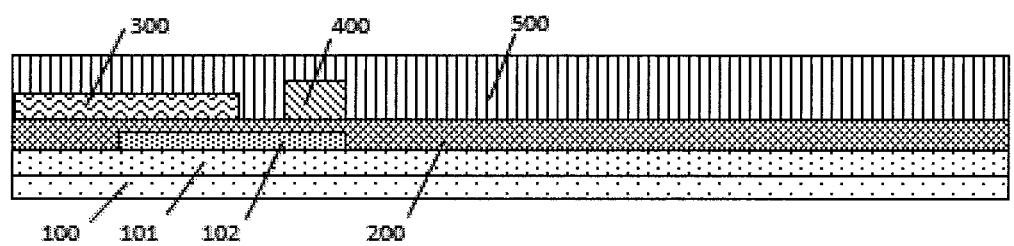
FIG. 11 is a schematic view in which deposition of a source-drain metal layer has been completed, according to an embodiment of the present disclosure.
Figure 12:
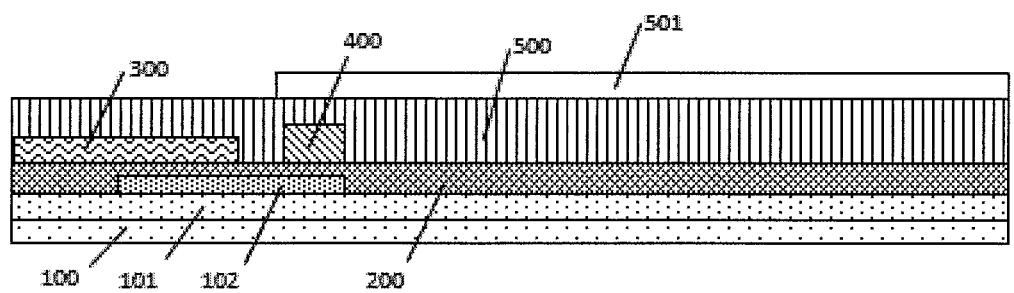
FIG. 12 is a schematic view in which exposure and development of the source-drain metal layer have been completed, according to an embodiment of the present disclosure.

7) Then, a source-drain metal layer 500 is deposited using for example a sputtering process, as shown in FIG. 11. After that, a photoresist layer is formed on the metal layer 500, and a source-drain photoresist pattern 501 is formed by performing lithography processes including exposure and development on the photoresist layer, as shown in FIG. 12.

Figure 13:
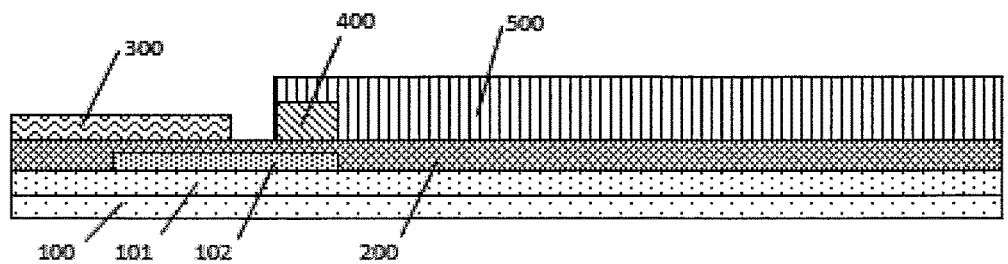
FIG. 13 is a schematic view in which etching and stripping of the source-drain metal layer have been completed, according to an embodiment of the present disclosure.

8) The source-drain metal layer is etched such that a portion of the source-drain metal layer not being covered with the pattern 501 is removed, and finally, the photoresist is stripped, using a stripping apparatus, to form a resultant pattern of the source-drain metal layer, as shown in FIG. 13. The pattern formed of the source-drain metal layer 500 may comprise a plurality of source-drain metal test lines 500' and a plurality of source-drain metal test blocks 500. In an example, the source-drain metal test lines 500' may have different predefined widths and are separated from one another, and, the source-drain metal test blocks 500 are different in sizes and are separated from one another.

Figure 14:
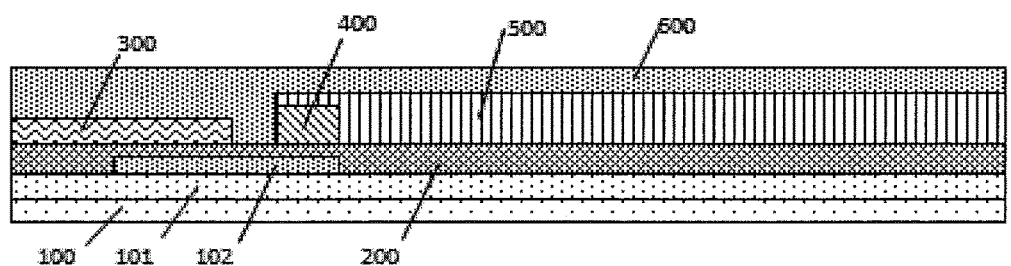
FIG. 14 is a schematic view in which deposition of a planarization layer has been completed, according to an embodiment of the present disclosure.
Figure 15A:
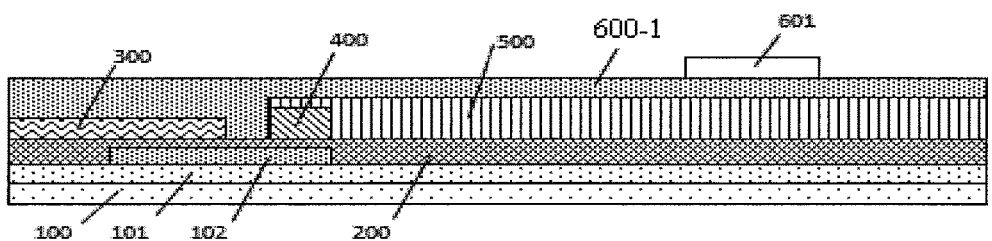
FIGS. 15a-b are schematic views showing exposure of the planarization layer, and in which exposure and development of the planarization layer have been completed, according to an embodiment of the present disclosure.
Figure 15B:
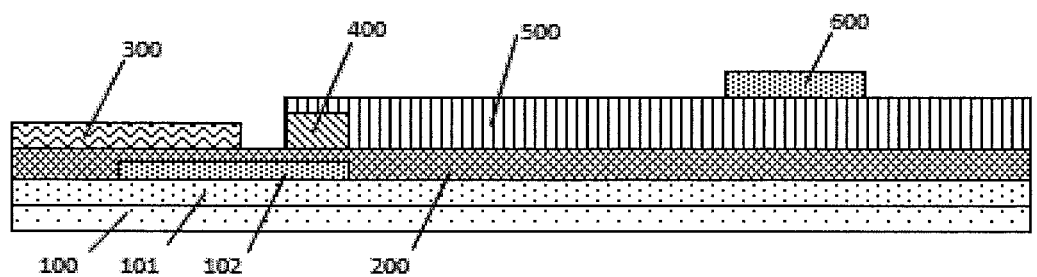

9) Then, a planarization layer 600-1 is deposited. A mask 601 (as shown in FIG. 15*a*) is formed after deposition of the planarization layer 600-1. The planarization layer 600-1 is performed using processes including etching, exposure, development and the like, to form a planarization layer pattern 600, as shown in FIGS. 14-15.

Figure 16:
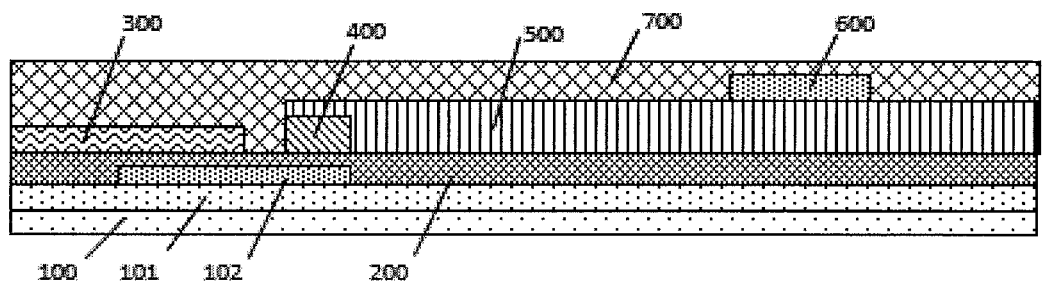
FIG. 16 is a schematic view in which deposition of a pixel electrode layer has been completed, according to an embodiment of the present disclosure.
Figure 17:
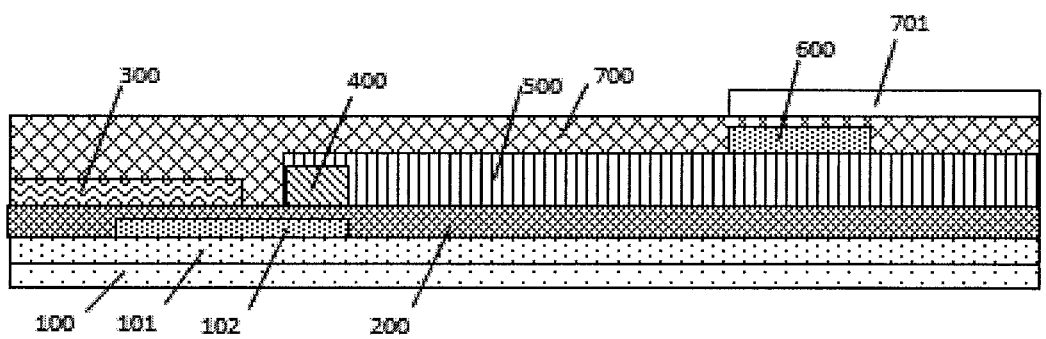
FIG. 17 is a schematic view in which exposure and development of the pixel electrode layer have been completed, according to an embodiment of the present disclosure.

10) Then, a pixel electrode layer 700 is deposited using for example a sputtering process, as shown in FIG. 16. After that, a photoresist layer is formed on the pixel electrode layer 700, and a pixel photoresist pattern 701 is formed by performing lithography processes including exposure and development on the photoresist layer, as shown in FIG. 17.

Figure 18:
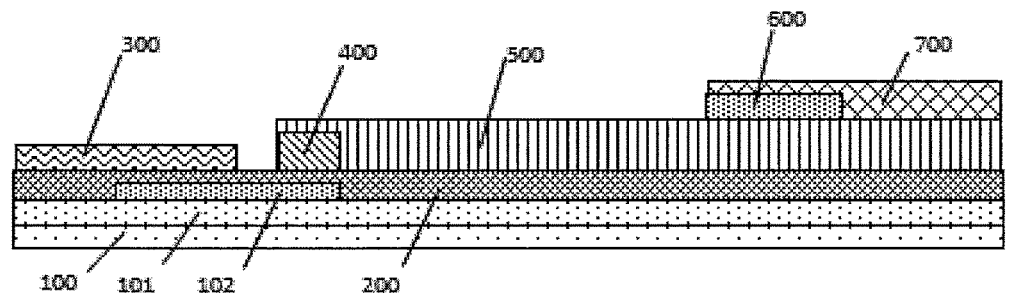
FIG. 18 is a schematic view in which etching and stripping of the pixel electrode layer have been completed, according to an embodiment of the present disclosure.

11) The pixel electrode layer is etched, and finally, the photoresist is stripped, using a stripping apparatus, to form a resultant pattern of the pixel electrode, as shown in FIG. 18. The pattern formed of the pixel electrode layer 700 may comprise a plurality of pixel electrode metal test lines 700' and a plurality of pixel electrode metal test blocks 700. In an example, the pixel electrode metal test lines 700' may have different predefined widths and are separated from one another, and, the pixel electrode metal test blocks 700 are different in sizes and are separated from one another.

In an embodiment of the present disclosure, the method of forming the test element unit may further comprise forming via-holes, which pass through the spacer layer to connect the metal lines in different layers so as to form electrical connection.

Herein, to observe whether or not the test lines or the test blocks are properly formed means that, to determine whether or not the test lines and the test blocks of the test patterns have predefined widths and whether or not a spacing between any two adjacent ones of the test lines or the test blocks, or, a spacing between the test line and the test block have predefined widths. Herein, CCD camera may be used to capture pictures of the test patterns, and the pictures captured by the CCD camera are analyzed so as to determine whether or not the widths and spacings of the test patterns meet predefined parameters.

In addition, when a test pattern and a display pattern provided in the same layer as the test pattern are formed of a metal material, it also is required to determine whether or not there is a short circuit between lines of the display patterns. At this moment, in order to determine whether or not the test pattern is properly formed, it is required to determine whether or not there is a short circuit between any two of the test lines and the test blocks of the same test pattern. Specifically, to determine whether or not there is a short circuit between any two of the test lines and the test blocks can be achieved by measuring a resistance between the any two of the test lines and the test blocks, and correspondingly, whether or not there is a short circuit between blocks, which have the same width as the measured test line and have the same size as the measured test block, in a display pattern within the display region, can be determined.

Capacitance value between the test blocks in different layers can be measured to determine whether or not the capacitance between test blocks in patterns of different layers formed within the display region meet predetermined requirements, thereby sizes of the test blocks located in different layers, spacings between the test blocks located in different layers, whether or not there is proper test line and via-hole connecting the test blocks, and the like, can be determined.

To observe whether or not the via-holes are properly formed includes to determine whether or not all the via-holes have been formed, and to determine whether or not diameters of all the via-holes have reached the predefined value.

A spacing between a side rim of a test block or test frame in an upper layer of test pattern and a side rim of a test block in a lower layer of test pattern is observed. If the spacing meets a predefined value, it indicates that the photolithography alignment process meets requirements, and, otherwise, it indicates that the photolithography alignment process does not meet the requirements and process parameters need to be adjusted.

Degree of overlapping between a source-drain metal layer 500 and a pixel electrode metal test block 700 can be measured by measuring a spacing between the source-drain metal test block 500 formed of a source-drain metal layer and the pixel electrode metal test block 70. Levels of lithography and etching processes on the source-drain metal layer may be detected at the same time by measuring widths of lines in the source-drain metal layer.

In this embodiment, after forming patterns in each of the metal layers, whether or not parameters of the processes meet requirements can be determined by measuring metal patterns within the test region. For example, by measuring sizes of these test blocks formed of the polysilicon layer 102, the gate metal layer 300, the source-drain metal layer 500 and the gate metal test line 300', the dielectric layer test line 400', the source-drain metal test line 500' and the pixel electrode test line 700' and spacings between these test lines, it can be determined whether or not sizes of corresponding line elements formed in respective layers within the display region and spacings between these line elements meet predefined requirements. By measuring sizes of the polysilicon test block 102, the gate metal test block 300, the dielectric layer test line 400', the source-drain metal test block 500 and the pixel electrode layer test block 700, it can be determined whether or not sizes of corresponding block elements formed in respective layers within the display region meet predefined requirements. By measuring a degree of overlapping between the polysilicon test block 102 and the gate metal layer test block 300, a degree of overlapping between the gate metal layer test block 300 and dielectric layer test line 400', a degree of overlapping between the gate metal layer test block 300 and the source-drain metal test block 500, and a degree of overlapping between the source-drain metal test block 500 and the pixel electrode layer test block 700, it can be determined whether or not degrees of overlapping between corresponding block elements in respective layers within the display region meet predefined requirements. As a result, levels of lithography and etching processes on these layers can be determined.

Figure 20:
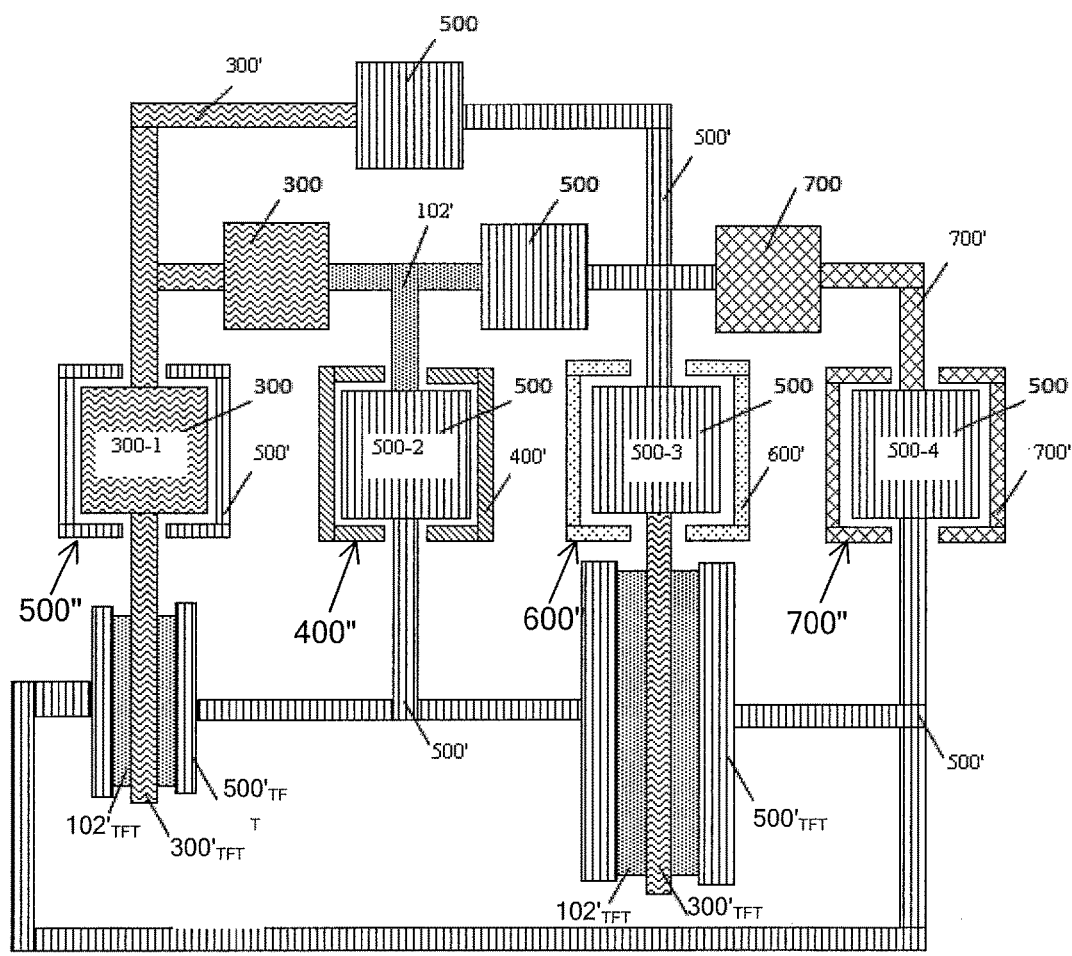
FIG. 20 is a top view showing patterns of a test element unit according to an embodiment of the present disclosure, when all the processes have been completed.

In an embodiment of the present disclosure, an interlayer capacitance value of a capacitor formed between test blocks in different layers can be measured, to determine whether or not parameters of related devices formed within the display region meet requirements for devices. For example, as shown in FIGS. 18 and 20, an interlayer capacitance value of a capacitor formed between the test block 102 in the active layer (in FIG. 20, the active layer test block 102 in a lower layer is shielded by the gate metal test block 300 in an upper layer and thus is not shown) and the gate metal test block 300 can be measured by applying test signals to the test block 300-1 and the test block 500-2. Here, the active layer test block 102 in the lower layer can be connected to a test line 102' provided in the same layer therewith, and further, the test line 102' can be connected to a test block 500-2 (which is not used as any one of electrodes of a capacitor) provided in a different layer, through a via-hole. It is easy to apply a test signal to the test block, for example, 500-2, compared to applying a test signal to the test block, for example, 102', so that efficiency and yield of detection can be improved. Interlayer capacitance value of a capacitor (which is formed by the gate metal layer 300 in a lower layer, the intermediate spacer layer or interior dielectric layer 400) and the source-drain metal layer 500 in an upper layer) formed between the gate metal test block 300 and the source-drain metal test block 500 can be measured by applying test signals to the test block 300-1 and the test block 500-3. Interlayer capacitance value of a capacitor (which is formed by the active layer 102 in a lower layer, the intermediate gate insulation layer 20 and the spacer layer or interior dielectric layer, and the source-drain metal layer 500 in an upper layer) formed between the active layer test block 102 and the source-drain metal test block 500 can be measured by applying test signals to the test block 500-2 and the test block 500-3. Interlayer capacitance value of a capacitor (which is formed by the source-drain metal layer 500, the intermediate planarization layer 600 and the pixel electrode layer 700 in an upper layer) formed between the source-drain metal test block 500 and the pixel electrode test block 700 can be measured by applying test signals to the test block 500-3 and the test block 500-4. For example, the test line 102' is connected to the test block 500-2 through via-hole (not shown) between two layers, and the test line 700' is connected to the test block 500-4 through via-hole (not shown) between two layers.

In embodiments of the present disclosure, the test lines may form thin-film transistors having channels of different sizes. By measuring parameters of the thin-film transistors having channels of different sizes, it can be determined whether or not parameters of corresponding thin-film transistors formed within the display region meet predetermined requirements. For example, referring to FIG. 20, two thin-film transistors are illustrated in a lower part of FIG. 20, where the thin-film transistor shown on left side of this Figure has a shorter channel and the thin-film transistor shown on right side of this Figure has a longer channel. The two thin-film transistors are formed of a polysilicon test line $102'_{TFT}$, a gate metal test line $300'_{TFT}$ and a source-drain metal test line $500'_{TFT}$. Sizes of the test lines of the thin-film transistor shown on the left side are smaller than those of the test lines of the thin-film transistor shown on the right side and thus the thin-film transistor shown on the left side has a channel with a smaller size. In addition, according to an embodiment of the present disclosure, as shown in FIG. 20, a drain electrode of the thin-film transistor having the shorter channel and a drain electrode of the thin-film transistor having the longer channel share one test block, namely, share the test block 500-2 shown in FIG. 20. In FIG. 20, a source electrode of the thin-film transistor having the shorter channel and a source electrode of the thin-film transistor having the longer channel share one test block, namely, share the test block 500-4 shown in FIG. 20. Such design is advantageous for measuring characteristics of the line elements, the block elements and the thin-film transistors at the same time with smaller number of test blocks and test lines.

In an alternative embodiment, as shown in FIG. 20, a source electrode of a thin-film transistor having a shorter channel and a source electrode of a thin-film transistor having a longer channel share one test block, namely, share the test block 500-2 shown in FIG. 20. In FIG. 20, a drain electrode of the thin-film transistor having the shorter channel and a drain electrode of the thin-film transistor having the longer channel share one test block, namely, share the test block 500-4 shown in FIG. 20. Exemplarily, characteristics of the thin-film transistor having the shorter channel on left side of FIG. 20 are measured by applying test signals to the test blocks 300-1, 500-2 and 500-4, and, characteristics of the thin-film transistor having the longer channel on right side of FIG. 20 are measured by applying test signals onto the test blocks 500-3, 500-2 and 500-4.

It should be noted that, in the above description of the present disclosure, some layers and test blocks formed of these layers are denoted using the same reference numbers, which indicates that a layer and a corresponding test block are formed of the same material in the same layer, during the same process, but they are located in the display region and the non-display region, respectively.

Although the present disclosure have been shown and described in details by referring to the exemplary embodiments of the present disclosure, it would be appreciated by those skilled in the art that various changes in forms and details may be made in these embodiments without departing from the principles and spirit of the present invention, the scope of which is defined in the claims.

What is claimed is:

1. A test element unit, comprising a plurality of layers of test patterns, each layer of test patterns comprising at least one test block, at least one capacitor being formed between test blocks located in different layers, two electrodes of each capacitor being two test blocks located in different layers, respectively;

wherein the test element unit is formed within a non-display area of a display device and is manufactured under same process conditions as process conditions of manufacturing components within a display area of the display device, and at least one of shapes, sizes and a spacing of the test patterns is configured to determine whether or not the process conditions of manufacturing the components within the display area of the display device meet desired requirements.

2. The test element unit of claim 1, wherein, said each layer of test patterns further comprises a plurality of test lines, and, at least one of the two test blocks forming the capacitor is electrically connected to at least one of the test lines located in a same layer therewith.

3. The test element unit of claim 2, wherein, the at least one of the test lines electrically connected to the at least one of the two test blocks forming the capacitor is further electrically connected to at least one test block which does not form the capacitor.

4. The test element unit of claim 2, wherein, the plurality of test lines comprises a polysilicon test line, a gate metal test line formed of a metal layer used for formation of a gate, a source-drain metal test line formed of a metal layer used for formation of a source electrode and a drain electrode, and a pixel electrode test line formed of a pixel electrode layer used for formation of a pixel electrode.

5. The test element unit of claim 4, wherein, two groups of test lines consisted of the polysilicon test line, the gate metal test line and the source-drain metal test line form a thin-film transistor having a first channel and a thin-film transistor having a second channel, and sizes of portions, which are configured for formation of the thin-film transistor, of the polysilicon test line, the gate metal test line and the source-drain metal test line in one of the two groups of test lines are different from sizes of corresponding portions, which are configured for formation of the thin-film transistor, of the polysilicon test line, the gate metal test line and the source-drain metal test line in the other of the two groups of test lines, so that a size of the first channel is different from a size of the second channel.

6. The test element unit of claim 5, wherein, the thin-film transistor having the first channel and the thin-film transistor having the second channel are configured such that, a drain electrode of the thin-film transistor having the first channel and a drain electrode of the thin-film transistor having the second channel share one test block serving as a contact electrode, and a source electrode of the thin-film transistor having the first channel and a source electrode of the thin-film transistor having the second channel share one test block serving as a contact electrode.

7. The test element unit of claim 1, wherein, the plurality of test blocks comprise a gate metal test block formed of a metal layer used for formation of a gate, a source-drain metal test block formed of a metal layer used for formation of a source electrode and a drain electrode, and a pixel electrode metal test block formed of a pixel electrode layer used for formation of a pixel electrode, and a layer where the gate metal test block is located, a layer where the source-drain metal test block is located and a layer where the pixel electrode metal test block is located are different from one another.

8. The test element unit of claim 7, wherein, the two electrodes of each capacitor comprise any two of the gate metal test block, the source-drain metal test block and the pixel electrode metal test block located in different layers, and the capacitor comprises a dielectric layer which is one of the gate insulation layer and the interlayer insulation layer.

9. The test element unit of claim 1, wherein, spacer layers are provided between different ones of plurality of layers of test patterns, and the spacer layers comprise at least one of a gate insulation layer and an interlayer insulation layer.

10. The test element unit of claim 1, wherein, the each layer of test patterns further comprises a test frame, wherein a projection of a test frame in an upper layer onto a lower layer is located outside a test block in the lower layer, and, an edge of the projection of the test frame in the upper layer onto the lower layer is separated from an edge of the test block in the lower layer.

11. An array substrate having a display region and a non-display region, wherein the array substrate comprises:
at least one said test element unit of claim 1 disposed within the non-display region, and
a plurality of data lines, a plurality of gate lines, a plurality of thin film transistors, a plurality of pixel electrodes disposed within the display region.

12. The array substrate of claim 11, wherein, at least one of the at least one said test element unit comprises two layers of test patterns, which include a lower layer of test patterns and an upper layer of test patterns, and wherein, the lower layer of test patterns and the upper layer of test patterns are configured and arranged such that:
the lower layer of test patterns is made of a semiconductor material and provided in a same layer as an active layer of the array substrate, and the upper layer of test patterns is made of a metal material and provided in a same layer as the plurality of data lines of the array substrate; or
the lower layer of test patterns is made of a metal material and provided in a same layer as the plurality of data lines of the array substrate, and the upper layer of test patterns is made of a metal material and provided in a same layer as the plurality of gate lines of the array substrate; or
the lower layer of test patterns is made of a metal material and provided in a same layer as the plurality of data lines of the array substrate, and the upper layer of test patterns is made of a transparent electrode material and provided in a same layer as the plurality of pixel electrodes of the array substrate.

13. The array substrate of claim 11, wherein, at least one of the at least one said test element unit comprises: a lower layer of test patterns made of a semiconductor material and provided in the same layer as an active layer of the array substrate, an intermediate layer of test patterns made of a metal material and provided in the same layer as the data lines of the array substrate, and an upper layer of test patterns made of a transparent electrode material and provided in the same layer as the pixel electrodes of the array substrate.

14. A display panel comprising the array substrate of claim 11.

15. A display apparatus comprising the display panel of claim 14.

16. A method of manufacturing an array substrate comprising a display region and a non-display region, the method comprising:
forming a plurality of layers of display patterns within the display region, while forming the test element unit of claim 1 within the non-display region; and,
measuring at least one of a size of the test pattern and a spacing between the test patterns, a capacitance of the capacitor, and a length of a channel of a transistor formed of a test line formed of a metal layer and a spacer layer of the test patterns.

17. The method of claim 16, further comprising:
determining whether or not parameters of a display pattern within the display region meet requirements, based on a result of measurement of the test patterns; and,
continuing to implement a subsequent process of manufacturing the array substrate when the parameters meet the requirements.

18. The method of claim 16, wherein, different layers of display patterns within the display region are connected with one another through via-holes passing through a spacer layer between two layers of display patterns, and the method comprises:
forming a lower layer of display patterns within the display region, while forming a lower layer of test patterns within the non-display region;
measuring parameters of the test patterns and determining whether or not the parameters meet requirements;
if the parameters meet requirements, forming a spacer layer including a gate insulation layer or an interlayer insulation layer, on the lower layer;

forming via-holes, which pass through the spacer layer, within both the display region and the non-display region, the via-holes within the non-display region being located above the test lines; and determining whether or not positions of the via-holes meet requirements.

19. The method of claim 16, wherein, each layer of test patterns comprises at least one test block, and a capacitor is formed between a test block in a lower layer and a test block in an upper layer, and the method comprises: measuring a capacitance of the capacitor so as to determine whether or not the capacitance meets a desired requirement.

20. The method of claim 16, wherein, each layer of test patterns comprises a plurality of test lines, and the test lines located in different layers form thin-film transistors having channels with different lengths, and the method comprises: measuring parameters of the different thin-film transistors.

* * * * *